(12) United States Patent
Marmaropoulos

US006439457B1

(10) Patent No.: US 6,439,457 B1
(45) Date of Patent: Aug. 27, 2002

(54) METHOD AND SYSTEM FOR PERSONALIZED MESSAGE STORAGE AND RETRIEVAL

(75) Inventor: George Marmaropoulos, Yorktown Heights, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/549,689

(22) Filed: Apr. 14, 2000

(51) Int. Cl.⁷ .................................................. G06K 5/00
(52) U.S. Cl. .................... 235/380; 235/382; 235/382.5; 235/384; 235/441
(58) Field of Search ................................. 235/380, 382, 235/382.5, 441, 486, 384; 705/41, 44

(56) References Cited

U.S. PATENT DOCUMENTS

| | | | | | |
|---|---|---|---|---|---|
| 4,639,225 A | * | 1/1987 | Washizuka | ................... | 358/254 |
| 4,779,138 A | * | 10/1988 | Nomura et al. | ............. | 358/236 |
| 5,015,830 A | * | 5/1991 | Masuzawa et al. | ......... | 235/441 |
| 5,245,329 A | * | 9/1993 | Gokcebay | ................ | 235/382.5 |
| 5,251,251 A | * | 10/1993 | Barber et al. | ........... | 379/355.08 |
| 5,278,395 A | * | 1/1994 | Benezet | ....................... | 235/384 |
| 5,313,235 A | | 5/1994 | Inoue et al. | .................... | 354/76 |
| 5,473,143 A | * | 12/1995 | Vak et al. | .................... | 235/375 |
| 5,499,465 A | | 3/1996 | Manico | ........................ | 40/152 |
| 5,520,544 A | | 5/1996 | Manico et al. | ............... | 434/317 |
| 5,526,407 A | * | 6/1996 | Russell et al. | ................ | 379/89 |
| 5,602,963 A | * | 2/1997 | Bissonnette et al. | ........ | 395/2.84 |
| 5,812,870 A | * | 9/1998 | Kikinis et al. | ............... | 395/800 |
| 5,884,281 A | * | 3/1999 | Smith et al. | ................... | 706/26 |
| 5,959,281 A | * | 9/1999 | Domiteaux | ................... | 235/454 |
| 6,014,648 A | * | 1/2000 | Brennan | ...................... | 235/380 |
| 6,055,592 A | * | 4/2000 | Smith | ........................ | 235/380 |
| 6,072,401 A | * | 6/2000 | Kumar | .................. | 340/825.25 |
| 6,107,988 A | * | 8/2000 | Phillips | ...................... | 345/156 |
| 6,202,209 B1 | * | 3/2001 | Bartholomew et al. | ........ | 717/11 |
| 6,212,408 B1 | * | 4/2001 | Son et al. | .................... | 455/563 |
| 6,223,233 B1 | * | 4/2001 | Kavanaugh et al. | .......... | 710/73 |
| 6,298,441 B1 | * | 10/2001 | Handelman et al. | ........ | 380/231 |

FOREIGN PATENT DOCUMENTS

| | | | | |
|---|---|---|---|---|
| GB | 2230360 A | 6/1998 | .......... | G11B/25/04 |
| WO | 94/28529 | 12/1994 | ............. | G09F/1/12 |

* cited by examiner

*Primary Examiner*—Thien M. Le
*Assistant Examiner*—Uyen-Chau Le
(74) *Attorney, Agent, or Firm*—Robert W. Strozier; Eric M. Bram (57) ABSTRACT

A personalized memory storage apparatus and an associated display apparatus for the personalized memory storage apparatus. The personalized memory storage apparatus, memory pebbles, include a body and a key, where the body includes an electronic unit having a chip, an input and output device, a battery or other power source and a reader/contact and the key includes an electronically readable element therein which is read by the reader/contact to allow activation of the electronic unit for recording and replaying electronic data. The memory pebble also includes a chamber or slot for storing a physical items such as a photograph, coin, emblem or the like. The display apparatus includes sockets for receiving the pebbles and generally a centralized playback unit for replaying the electronic data contained in each pebble. The display apparatus allows large number of pebbles to be viewed for present and future enjoyment.

10 Claims, 10 Drawing Sheets

METHOD AND SYSTEM FOR PERSONALIZED MESSAGE STORAGE AND RETRIEVAL

BACKGROUND OF THE INVENTION

1. Field of the Invention

The present invention relates to an apparatus for storage of personalized data in physical and electronic form having an activating key to be retained by a user after data storage, to an apparatus and method for display of the personalized data storage apparatus and to method for making and using the apparatus.

More particularly, the present invention relates to personalized memory apparatus or pebbles having a key with a unique activation code. When the key is inserted into the pebble, a user can store electronically, data such as an "electronic memory" or message, which becomes permanent when the key is removed. The pebble can also store a physical item such as a photograph, a drawing, or the like. The pebbles are designed for storage in a display apparatus so that the pebbles are viewable by the public and the stored electronic data can be played or displayed. Alternatively, the contents of the pebbles can be transferred and stored in a central electronic storage device (such as a server) so that the contents of the pebbles can be accessed through a local or global network such as the www. The present invention also relates to method for making and storing the pebbles and methods for making pebble displays and interactively viewing pebbles in the displays.

2. Description of the Related Art

With the new millennium approaching, a new century starting and the change of the year 2000, humans are reflecting on the changes over the past 1000 years, 100 years and decade. Deep in the human nature springs the thrill of leaving traces of their presence and existence on this planet. From the Paleolithic art in the Chauvet Cave in France, to the graffiti on the walls of the Bronx, this primitive instinct is a neverending struggle to verify our existence and extend our spiritual presence beyond the time and space limitations of our body. It is an attempt to reach immortality.

As we approach the new millennium, more than ever, we feel the urge to leave our personal mark in an indelible way—a mark that will remind us, and the generations to come, of our existence in these significant coordinates of time and space. The Millennium Dome in London, England and the Millennium Wheel are macro-scale examples of such attempts. They represent a whole nation, but they fail to express the individual member of the nation.

Although devices exist for displaying physical items and storing electronic audio messages for playback, these devices are not designed for the permanent storage and display of memories or to mark an individuals presence in these times.

One such device in described in UK Patent Application GB 2 320 360 A which is a sound reproducing system including a card with an integrated circuit for storing data and a playback unit that reproduces the stored data when the card in inserted therein.

U.S. Pat. No. 5,499,465 discloses a talking picture frame where an audio message is associated with a physical picture so that the receiver will obtain an audiovisual representation of the person(s) in the photograph.

Similarly, PCT Application No. WO 94/28529 discloses a personalized audio gift that can be in the picture frame, a sign or a greeting device.

However, none of these devices are designed to store enduring memories to mark our presence in the times and to allow future generations gain a better understanding of the individuals that inhabited this time. Thus, it would advance in the art to construct personalized data storage units with activation keys having a unique activation, where the units are designed to be deposited in a centralized storage (physical or virtual) and display units accessible to the general public either by visiting a physical display structure or remotely by visiting a dedicated virtual or electronic space on the www or on a dial-up server or from a CD-ROM containing the stored contents of the personalized data storage units.

SUMMARY OF THE INVENTION

The present invention provides personalized memory storage apparatus sometimes referred to herein as memory pebbles. Each memory pebble includes an integrated circuit for inputting, storing and outputting personalized electronic data such as an audio message, an electronic image, or the like or combination or mixtures thereof. Each memory pebble also includes an area for inserting a physical item such as a photograph, coin, emblem, drawing, code of arms, etc. Each memory pebble further includes a key having a unique activation code which corresponds to this particular pebble and a slot or lock for receiving the key. In one embodiment, when the key is inserted into the lock or slot, then the integrated circuit is activated and personalized electronic data can be inputted into a memory associated with the pebble. Once removed, the stored electronic data will be permanent and the key can be saved. The key can also be ornamental so that it can be worn as jewelry. Alternatively and preferably, the pebble can be activated with the key via simply inserting the key but without the need of reading and verifying the key code. The key code is also designed to allow the holder to easily locate a particular pebble in a physical or virtual display unit. The term virtual display or virtual display unit means a display format that exists in cyberspace. The cyberspace or virtual display can be implemented on a server accessible over the a network such as the world wide web or can be implemented on individual computer, other display/digital processing unit devices or the like.

The present invention also provides a display apparatus sometimes referred to herein as a memory mosaic, where the apparatus includes a support for supporting the apparatus and a display surface for receiving memory pebbles for permanent, temporary or periodic display and playback of the electronic data. The display surface can be designed so that the memory pebbles are arranged on the surface in a given pattern.

The present invention provides a method for storing physical and electronic data on a personalized memory storage apparatus (memory pebble), where the method includes inputting personalized electronic data into a memory associated with the integrated circuit. The input step can be accomplished by simply touching the pebble or by inserting the key into a slot, which acts to turn the pebble ON. Removing the key turns the pebble OFF. The act of key insertion can also reset the pebble's memory for re-recording. A unique code can also be associated with the memory or/and with the personalized data, which allows identification and access to the data stored therein. Optionally, the method can include the step of inserting a key having a unique code into the apparatus to activate an integrated circuit associated with the apparatus. After the user has entered the electronic data, the user removes the key making the data permanent until the key is reinserted to modify the stored data. With the key removed, the user optionally insert a physical item into the physical item storage area or compartment associated with the apparatus. The user then sends or delivers the apparatus to a display site for inclusion into a memory mosaic. The key code can also be used to access the electronic data of the pebble remotely, e.g., via the internet (www), where accessing means that the data contents of a pebble can be available for either playback or modification, with modification being optional.

The present invention also provides a method for storing the personalized memory storage apparatus in a mosaic, where the method includes receiving an apparatus and inserting the apparatus into a receiving slot in a display surface of a display apparatus so that each personalized memory storage apparatus can be viewed and activate for electronic data playback.

DESCRIPTION OF THE DRAWINGS

The invention can be better understood with reference to the following detailed description together with the appended illustrative drawings in which like elements are numbered the same.

DETAILED DESCRIPTION OF THE INVENTION

The inventor has found that a personalized memory storage apparatus or memory pebble can be constructed that includes an integrated circuit having a memory for storing personalized electronic data activated by a key having a unique code. The pebble also includes an area designed to review a physical item transforming the pebble into a multimedia apparatus. The inventor has also found that the pebbles can be collected and displayed on a display apparatus to construct a memory mosaic by arranging the pebbles on a viewable surface of the display apparatus. The inventor has constructed the display apparatus to serve as a permanent or semi-permanent media for the retention and enjoyment of the pebbles. If the display apparatus if for public viewing, then the mosaic can serve as a documentary exhibit our generation and future generations.

Broadly, the present invention relates to a personalized memory storage apparatus including a body having an electronic circuit including a digital processing unit, a memory, an input device, an output device, an optional activation connector and circuitry interconnecting the unit, memory and I/O devices, connector. The body also includes a physical item storage area or chamber adapted to receive a physical item. The body also includes a slot adapted to receive a key, where the key has a unique identification code stored therein. The key with its unique code is primarily used to locate a particular personalized data storage unit or pebble or its contents in a physical or virtual display unit. For example, imagine a display (physical or virtual) with 10 million pebbles and that someone wants to find his/her grandfather's pebble, the unique code associated with the ornamental key is his/her locating device. He/she would simply insert the key into a receptacle at the display or enter the code in his/her home computer, and the software associated with the display would locate the pebble or its contents based on the unique code.

Additionally, the pebble can also be constructed so that when the key is inserted into the slot, the unique code stored in the key is read by a reading device or contact in the slot. If the unique code on the key matches the code of the integrated circuit, then the integrated circuit is activated and personalized data can be input into the memory of the circuit through the input device. The output device allows the user to verify, edit or re-input personalized data and allows other to playback the stored electronic data once the key is removed.

The present invention also relates broadly to a display apparatus including a support structure, a playback unit and a plurality of slots having a connector where the slots are adapted to receive a personalized memory storage apparatus or pebble and allow the pebble to be placed into communication with the playback unit.

The present invention further relates to methods for storing electronic data and physical items in the pebbles, for arranging the pebbles into a mosaic on a viewable surface of a display apparatus and for interacting with the pebbles and display apparatus.

The present invention provides personalized memory storage apparatus or memory pebbles. Each memory pebble includes an integrated circuit for inputting, storing and outputting personalized electronic data such as audio data, image data, coded data, encrypted data, linking data or the like or combination or mixtures thereof Each memory pebble also includes an area or chamber designed to receive a physical item such as a photograph, coin, emblem, drawing, code of arms, etc. Each memory pebble further includes a key having a unique identification/activation code and a slot for receiving the key. Again, the key allows its holder to locate a specific pebble or its contents in a physical or virtual display unit. The key can also act as a circuit activator similar to a switch. Additionally, the key can act as a coded circuit activator. Thus, when the key is inserted into the slot, then the key interfaces with the integrated circuit activation connector and if the code of the key matches the code of the integrated circuit, then the integrated circuit is activated and personalized electronic data can be inputted into a memory associated with the integrated circuit. Once removed, the stored electronic data will be semi-permanent and preferably permanent and the key can be saved. The key can also be ornamental so that it can be worn as jewelry. The key can also comprise multiple objects so that the key can be disassembled to form a pair of earrings, or bracelet ornaments where each part includes the keys unique code stored therein. This embodiment allows multiple people to retain a key to the pebble as well. Each pebble can also include record and playback on/off switches or touch pads and optionally reset (rerecord) switches or touch pads so that the input and output devices can be activated and deactivated.

The present invention also provides a display apparatus sometimes referred to herein as a memory mosaic, where the apparatus includes a support structure and a display surface for receiving memory pebbles for permanent, temporary or periodic display and playback of each pebble's electronic data. The display surface can be designed so that the memory pebbles are arranged on the surface in a given pattern. The pattern can be constructed so that pebbles form an image. The display apparatus can also be a large or huge wall such as a wall of a dam, the face of a mountain or cliff or a building face or the like with structure to allow people to climb and/or walk from the ground level of the wall up to its highest point. The pebbles would be set into the wall so that as the wall is ascended or descended, people could view the pebbles and experience their electronic data.

If the display apparatus is virtual, then the display surfaces would be display screens in a web site, where the user would have standard browsing commands available to jump to different categories of pebbles. The web site could also have pre-designed tours that would take the viewer through a predetermined or selectable format for the display of the pebbles. If the display format is virtual reality, then the user would don VR equipment and traverse a virtual arrangement of pebbles in a preset arrangement or construct or a selectable construct. Thus, the virtual site may provide the pebbles to be viewable as pages of pebbles or the site may provide for simulated building with viewing galleries or the like. The virtual site may also provide any type of construct with touring software to allow the user to traverse the virtual construct. The virtual site may also searching and filtering software so that a user can limit the viewable pebbles to some desired set of pebbles, e.g., time limited, location limited, type limited, or the like. Thus, in electronic or physical displays, the pebbles can be categorized, classified, structured, databased or the like to allow different view formats or to allow different display formats. The virtual display can also be stored on a mass storage device such as a hard drive, a CD-ROM or the like, so that the display including all or part of the stored pebbles can be accessed and viewed from individual computers or display devices including a digital processing unit.

The present invention provides a method for storing physical and electronic data on a personalized memory storage apparatus or memory pebble, where the method includes inputting personalized electronic data into a memory associated with the integrated circuit via an input device also associated with the integrated circuit either by simply speaking into the device or by depressing an ON/OFF switch or button or by simply inserting or pulling out the key associated with the pebble. Optionally, the personalized memory storage apparatus must be activated with the key by inserting a key having a unique code into the apparatus to activate an integrated circuit associated with the apparatus. After the user has entered the personalized electronic data, the user removes the key making the data permanent until the key is reinserted to modify the stored data. With the key removed, the user can optionally insert a physical item into the physical item storage area, chamber or compartment associated with the apparatus. The user then either inserts the pebble into a private display apparatus or sends or delivers the apparatus to a public display site for inclusion into a public viewable memory mosaic.

The present invention also provides a method for storing the personalized memory storage apparatus in a mosaic, where the method includes receiving an apparatus and inserting the apparatus into a receiving slot in a display surface of a display apparatus so that each personalized memory storage apparatus can be viewed and activate for electronic data playback.

Suitable circuitry can be any traditional or state-of-the art circuitry that will accomplish the requirements of the pebbles. The circuitry can include, without limitation, traditional wires made of a conductive material or a circuit board where all devices are mounted on the board or connected to the board by insulated wires. The chip used in the pebbles of the present invention are any small digital processing unit with an associated memory and contact or pins so that the chip can be connected to output and input devices.

The invention will now be described in more detail in reference to the drawing where preferred embodiments are detailed. The drawings themselves are for illustrative purposes where like elements may be numbered the same and the size and scale are for convenience and do not represent the true shape and/or thickness of individual elements.

Figure 1A:
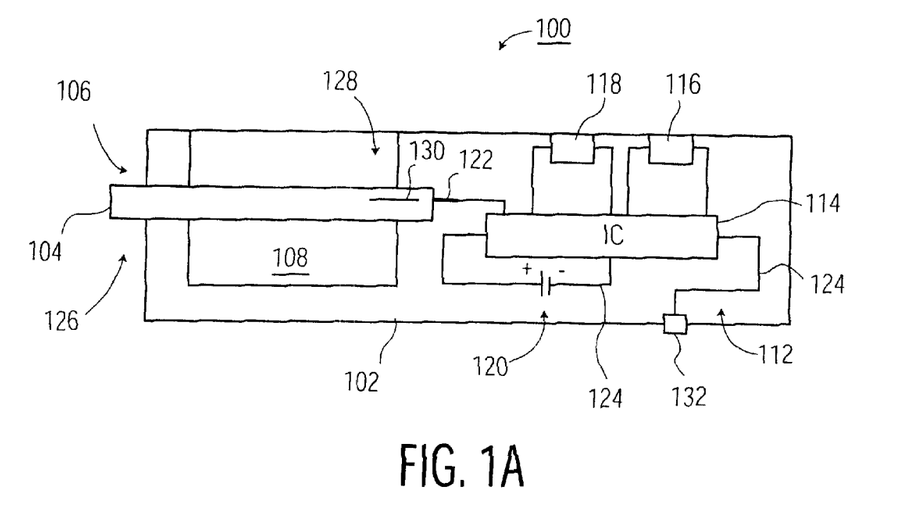
FIG. 1A is a side cross-sectional view of one embodiment of a memory pebble of this invention.
Figure 1B:
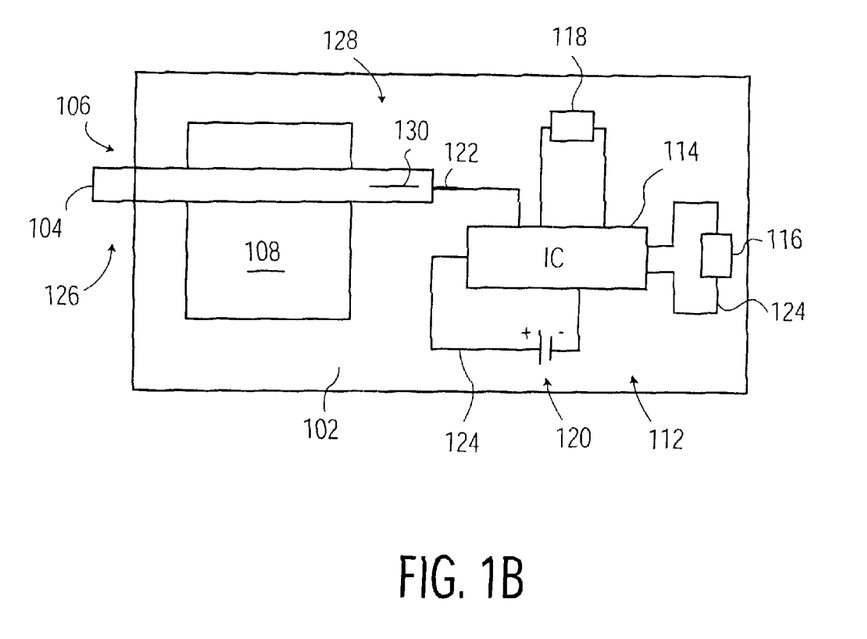
FIG. 1B is a top cross-sectional view of the pebble of FIG. 1A.

Referring now to FIGS. 1A–B, a generic embodiment of a personalize memory apparatus generally 100 of this invention is shown to include a body 102 and a key 104. The body 102 includes a slot 106 for receiving the key 104 and a chamber 108 designed to receive a physical object (not shown). The physical object can be a photograph, a coin, an emblem, a needlepoint or embroidered cloth, a seal or the like. If the physical object is a photograph or other relatively flat object, then the slot 106 will have a sufficient length and width to allow the flat object to be inserted therein. Moreover, the slot 106 will also include a channel, groove(s) or indentation(s) (not shown), where the channel guides the key 104 into its proper position during the insertion process. The body 102 also includes an electronic data storage, recording and playback apparatus 112. The electronic apparatus 112 includes a chip 114, an output device 116, an input device 118, a battery 120 and a contact/reader 122 and associated wires 124 connecting the chip 114 to the other components. Alternatively, the contact/reader 122 can simply be an ON/OFF switch, which turns on the pebble 100 when the key 104 is inserted and turns of the pebble 100 when the key 104 is removed. The chip 114 includes a digital processing unit, a memory, buses and I/O ports as is well known in the art. Of course, any other power source could work as well such as a photovoltaic cell or the like.

The key 104 includes a head part 126 and a tail part 128. The tail part 128 is designed to insert into the slot 106 and guided by the slot 106. The tail part 128 also includes a readable medium 130 containing a unique readable code. If the pebble 100 key activated, then when the key 104 is inserted into the slot 106 to its engaged position, the medium 130 will be brought into communication contact with the contact/reader 122. The reader 122 reads the key code stored in the medium 130. The chip 114 will then compare the read code to an activation code stored in the chip 114. If the codes match, then the chip 114 will be activated and will be available for data input. Optionally, the apparatus can include a connector 132, where the connector will allow an interface between the pebbles and a display apparatus of the present invention as well as serve as an auxiliary input and output connection to the chip 114. The connector 132 will also include power connections so that the battery in the pebble can be bypassed. If used as an auxiliary I/O connection to the chip 114, then stereo or two channel electronic data can be stored in the apparatus. If the pebble includes the connector 132, then when the pebble is attached to the display unit, the electronic data can be transferred from the pebble to a mass electronic storage device associated with the display unit. After transfer, the pebble's electronic can be removed and recycled. The pebble 100 can also include a touch pad or button pad which includes ON/OFF pads, buttons or switches for the input and output devices or other pads, buttons or switches to turn the devices ON and OFF. The pebbles may also include reset and/or rewind pads, buttons or switches. Alternatively, the pebbles input and output devices of the pebble can simply be activated by touching the pebble or very getting close to the pebble using any capacitive, resistive or similar technologies or by using proximity sensors or the like. Preferably, the key 104 and the contact 122 act as the ON/OFF, reset switch.

The input device can be an internal device such as a microphone or any other internal device capable of generating electronic data for storage in the apparatus 100 or a jacket adapted to connect the apparatus 100 to an external device such as an external microphone, a computer, a digital camera, or any other similar device that can send electronic data to the apparatus 100 via the input jacket. Any miniature microphone can be used in the present invention including tradition microphone, condensed microphones or any other device for converting sound into electronic data.

The output device can be an internal device such as a speaker, an LCD display, a light array display or any other device capable of playing back stored electronic data or the output device can be an output jacket allowing connection to an external device such as a computer, an external speaker, a digital cameras video screen (CRT) or flat screen (LCD) or any other device capable of playing back stored electronic data. Any micro speaker or sound generating device can be used in this invention including diaphragm speaker or any other device for generating or reproducing a human or animal voice.

Figure 2A:
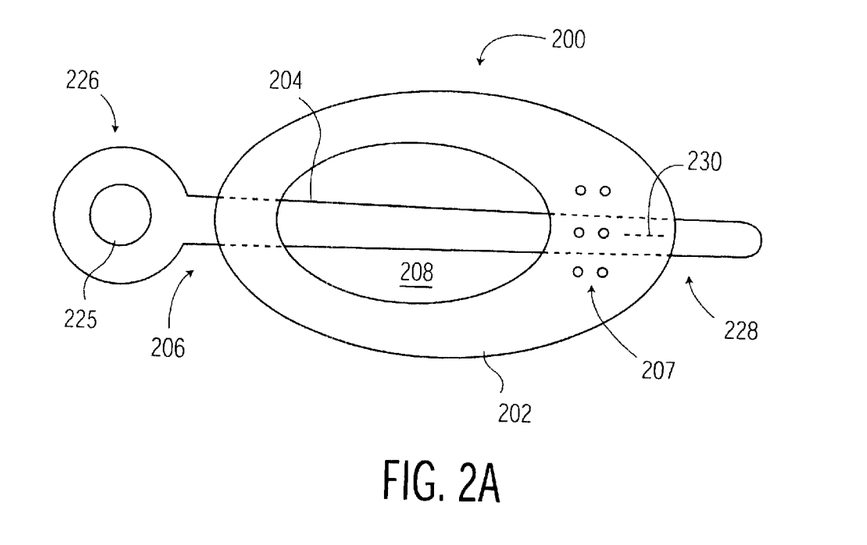
FIG. 2A is a side cross-sectional view of another embodiment of a memory pebble of this invention.
Figure 2B:
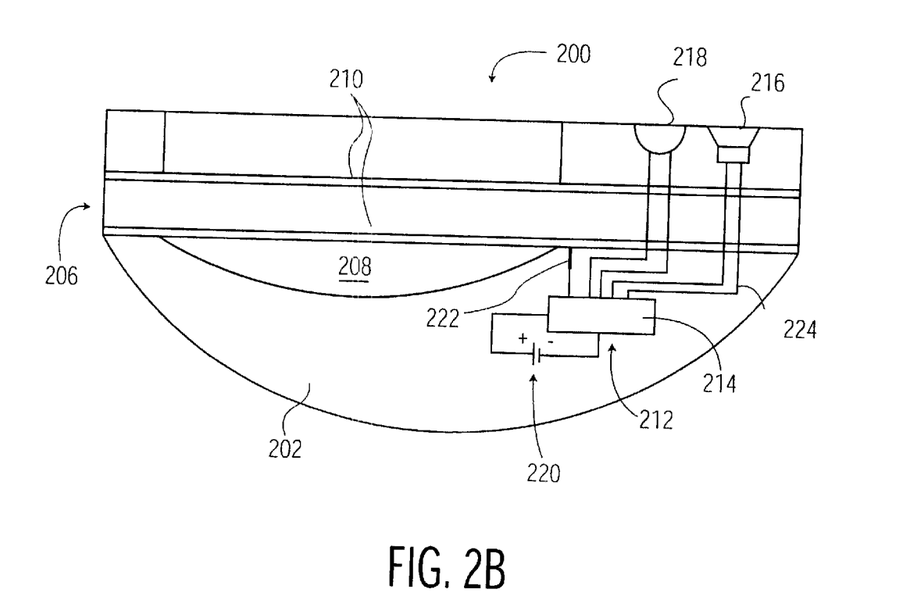
FIG. 2B is a top cross-sectional view of the pebble of FIG. 2A.
Figure 3A:
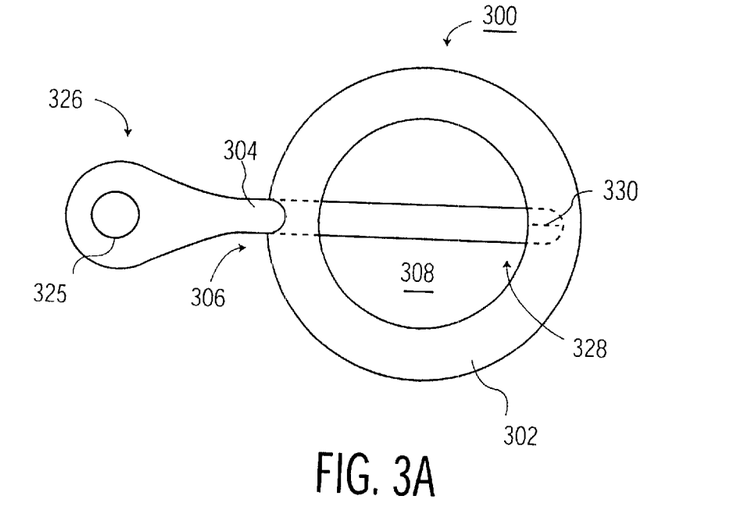
FIG. 3A is a top view of another embodiment of a memory pebble of this invention.
Figure 3B:
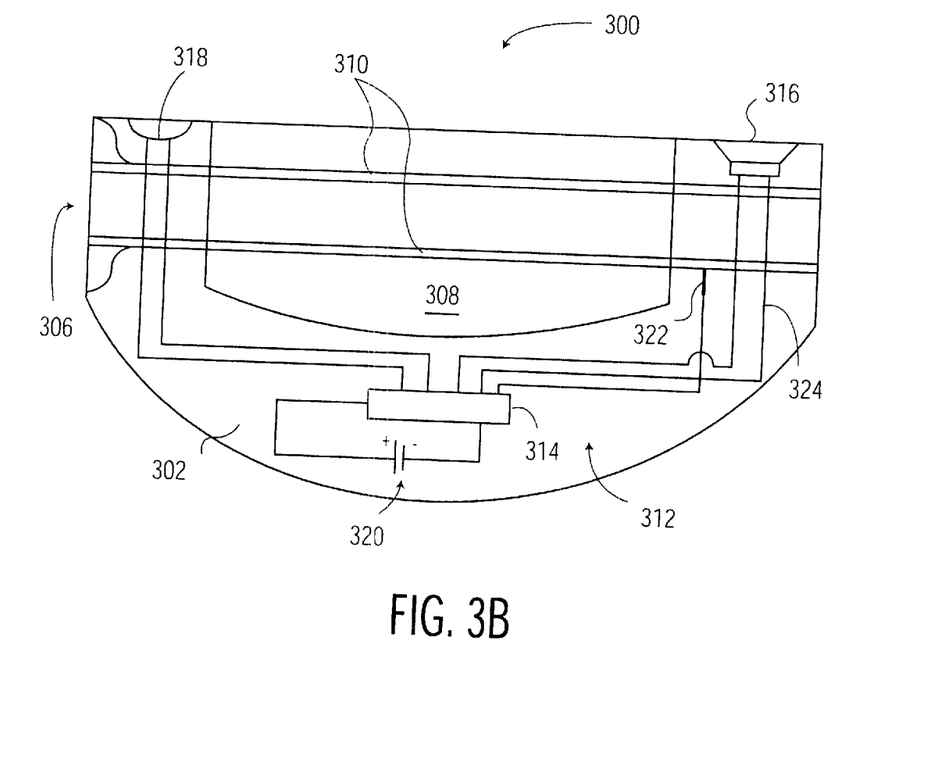
FIG. 3B is a side cross-sectional view of the pebble of FIG. 2A.

The shape of the personalized memory storage apparatus of the present invention can be any desired shape including a rectangular solid as shown in FIGS. 1A–B, an oval shape as shown in FIGS. 2A–B or a circular shape as shown in FIGS. 3A–B. Any other solid shape or 3D shape can be used as well including, without limitation, spherical, trapezoidal, triangular, pentagonal, hexagonal, icosahedrons, dodecahedron, irregular shape, shape of animals, people, cartoon characters, politicians, devices (telephones, TV, CRTs, etc.), building, bridges, body parts, or the like. Moreover, the apparatus can be a composite structure or aggregate structure including any combination or mixture of any 3D shape. The apparatus can be one color or multicolored. The apparatus can have images, insignias, emblems, names or the like associated therewith. The apparatus can be made of any desired material including, without limitation, metals, plastics, woods, composites, stones, masonry, ceramics, or mixture or combination thereof.

Referring now to FIGS. 2A–B, another preferred embodiment of a personalize memory apparatus generally 200 of this invention is shown to include a body 202 and a key 204. The body 202 includes a slot 206 for receiving the key 204, a plurality of small holes or perforations 207 and a chamber 208 designed to receive a physical object (not shown). The physical object can be a photograph, a coin, an emblem, a needle point or embroidered cloth, a seal or the like. If the physical object is a photograph or other relatively flat object, then the slot 206 will have a sufficient length and width to allow the flat object to be inserted therein. Moreover, the slot 206 will also include a channel, groove(s) or indentation(s) 210, where the channel 210 guides the key 204 into its proper position during the insertion process. The body 202 also includes an electronic data storage, recording and playback apparatus 212. The electronic apparatus 212 includes a chip 214, a speaker 216, a microphone 218, a battery 220 and a contact/reader 222 and associated wires 224 connecting the chip 214 to the other components. The speaker 216 and microphone 218 are position below the perforations 207 to improve audio transmission and reception. The chip 214 includes a digital processing unit, a memory, buses and I/O ports as is well-known in the art.

The key 204 includes a hole 225, a head part 226 and a tail part 228. The tail part 228 is designed to be inserted in the slot 206 and guided by the channel 210. The tail part 228 also includes a readable medium 230 containing a unique readable code. When the key 204 is inserted into the slot 206 to its engaged position, the medium 230 will be brought into communication contact with the contact/reader 222. The reader 222 reads the key code stored in the medium 230. The chip 214 will then compare the read code to an activation code stored in the chip 214. If the codes match, then the chip 214 will be activated and will be available for data input.

Referring now to FIGS. 3A–B, another preferred embodiment of a personalize memory apparatus generally 300 of this invention is shown to include a body 302 and a key 304. The body 302 includes a slot 306 for receiving the key 304 and a chamber 308 designed to receive a physical object (not shown). The physical object can be a photograph, a coin, an emblem, a needle point or embroidered cloth, a seal or the like. If the physical object is a photograph or other relatively flat object, then the slot 306 will have a sufficient length and width to allow the flat object to be inserted therein. Moreover, the slot 306 will also include a channel, groove(s) or indentation(s) 310, where the channel 310 guides the key 304 into its proper position during the insertion process. The body 302 also includes an electronic data storage, recording and playback apparatus 312. The electronic apparatus 312 includes a chip 314, a speaker 316, a microphone 318, a battery. 320 and a contact/reader 322 and associated wires 324 connecting the chip 314 to the other components. The chip 314 includes a digital processing unit, a memory, buses and I/O ports as is well known in the art.

The key 304 includes a hole 325, a head part 326 and a tail part 328. The tail part 328 is designed to insert into the slot 306 and guided by the channel 310. The tail part 328 also includes a readable medium 330 containing a unique readable code. When the key 304 is inserted into the slot 306 to its engaged position, the medium 330 will be brought into communication contact with the contact/reader 322. The reader 322 reads the key code stored in the medium 330. The chip 314 will then compare the read code to an activation code stored in the chip 314. If the codes match, then the chip 314 will be activated and will be available for data input.

Figure 3C:
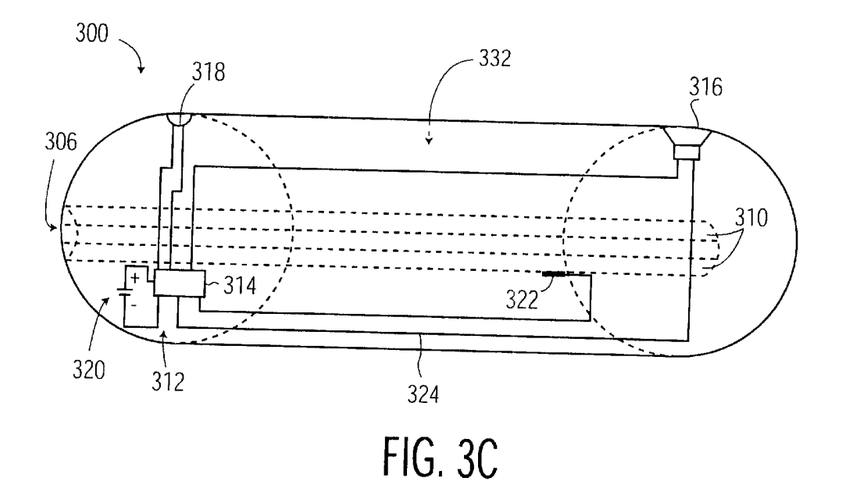
FIG. 3C is a side cross-sectional view of a second form of the pebble of FIG. 2A.

Alternatively, as shown in FIG. 3C, the body 302 can be torus shaped with a passage 332 therethrough. In such as case, the slot 306 would allow a picture or other flat physical object to be centered so that it would occupy the passage 332.

Referring now to FIGS. 4A–F, several preferred embodiments of a key generally 400 of this invention are shown to include a head portion 402, a middle portion 404 and a tail portion 406. Looking at FIG. 4A, the head portion 402 includes a hole 408 therethrough. The hole 402 allows the key to be worn as a piece of jewelry such as on a necklace or on a bracelet. The tail portion 406 also includes an electronically readable medium 410 which has a unique code burned into the medium. The medium 410 can be any medium capable of storing a code that can be read by an electronic reading device. The medium 410 can be a magnetizable medium where the code comprises a magnetic code or any other medium capable of storing a readable code. Alternatively, the key can be toothed and slot adapted to accept a given tooth pattern or otherwise machined so that only a single toothed key will fit into each pebble. In such an embodiment, the reader connector associated with the chip need only be an ON/OFF activation switch.

Figure 4A:
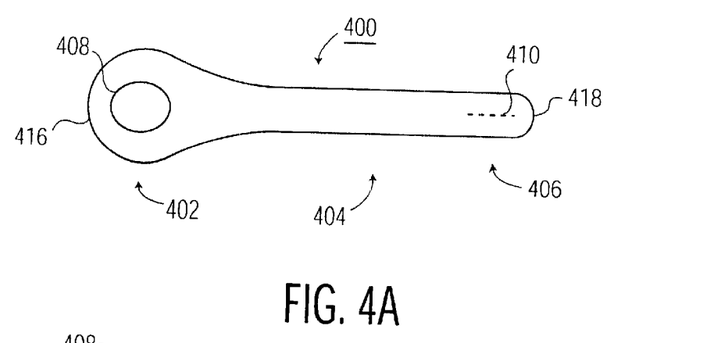
FIGS. 4A–F are examples of keys associated with the pebbles of this invention.
Figure 4B:
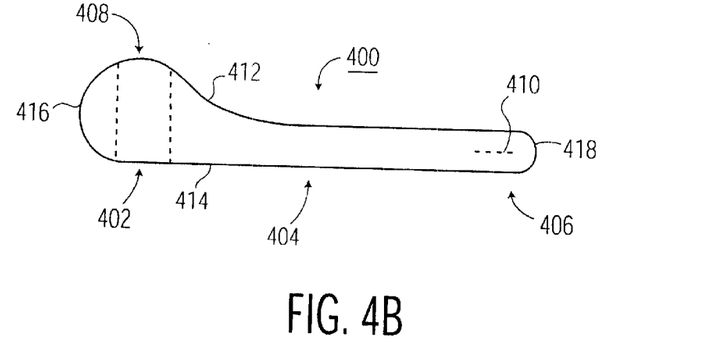

Looking at FIG. 4B, one embodiment of the key 400 is shown in a side view and has a tear drop shaped upper contour 412 raised at the head portion 402, tapering to substantially flat in the middle and tail portions 404 and 406 and a substantially flat lower contour 414. The key 400 is rounded at a head end 416 and at a tail end 418.

Figure 4C:
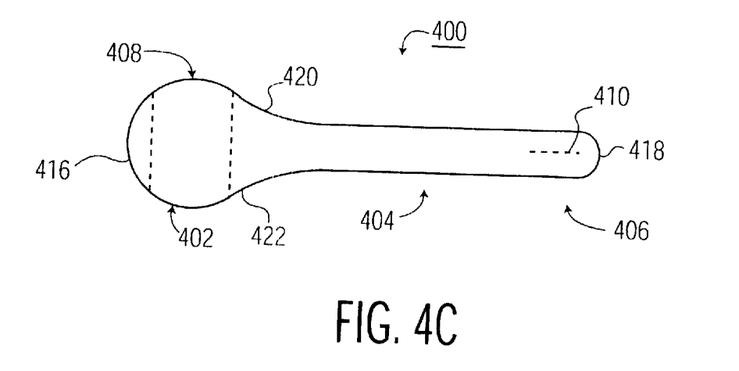

Looking at FIG. 4C, another embodiment of the key 400 is shown in a side view and has a tear drop shaped upper contour 420 and a tear drop shaped lower contour 422 where both contours 420 and 422 are raised at the head portion 402, tapering to substantially flat in the middle and tail portions 404 and 406. Again, the ends 416 and 418 are shown rounded.

Figure 4D:
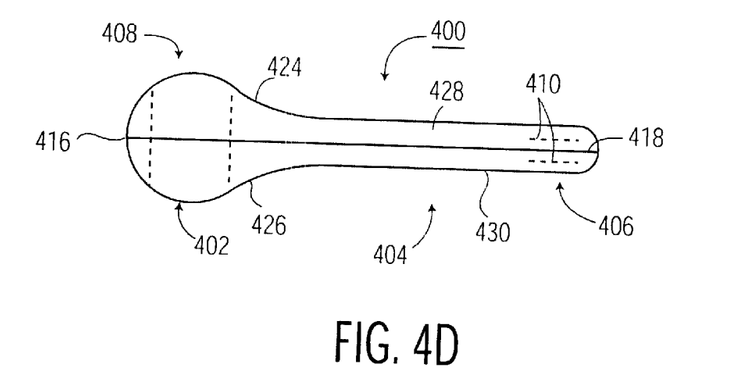

Looking at FIG. 4D, another embodiment of the key 400 is shown in a side view and has a tear drop shaped upper contour 424 and a tear drop shaped lower contour 426 where both contours 420 and 422 are raised at the head portion 402, tapering to substantially flat in the middle and tail portions 404 and 406. This embodiment depicts that key 400 has comprising a top half 428 and a bottom half 430 which are separable one from the other so that the halves can be worn as a pair of earrings. Again, the ends 416 and 418 are shown rounded. The two halves 428 and 430 can be joined together by any mechanical interlocking structure as is well known in the art such as a tough and groove interlocking structure or a snap structure or any other interlocking mechanical structure. Alternatively, the slot in the pebble can be structure so that each part of the key is inserted separately and the pebble only operates when all parts have been inserted.

Figure 4E:
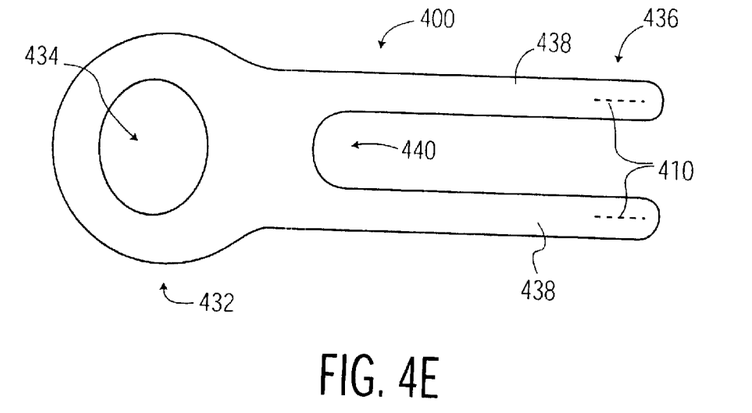

Looking at FIG. 4E, another embodiment of the key 400 is shown in a top view including a circular shaped head portion 432 a having an oval shaped hole 434 and a tail portion 436 including two tail members 438 which form an internal U 440 therebetween. The head portion 432 smoothly transitions into the substantially straight tail members 438. This embodiment can have any desired side view contouring including those shown in FIGS. 4B–D.

Figure 4F:
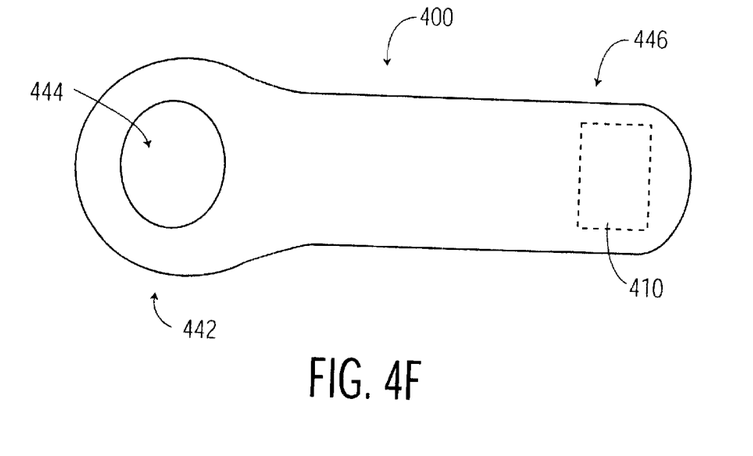
Figure 5A:
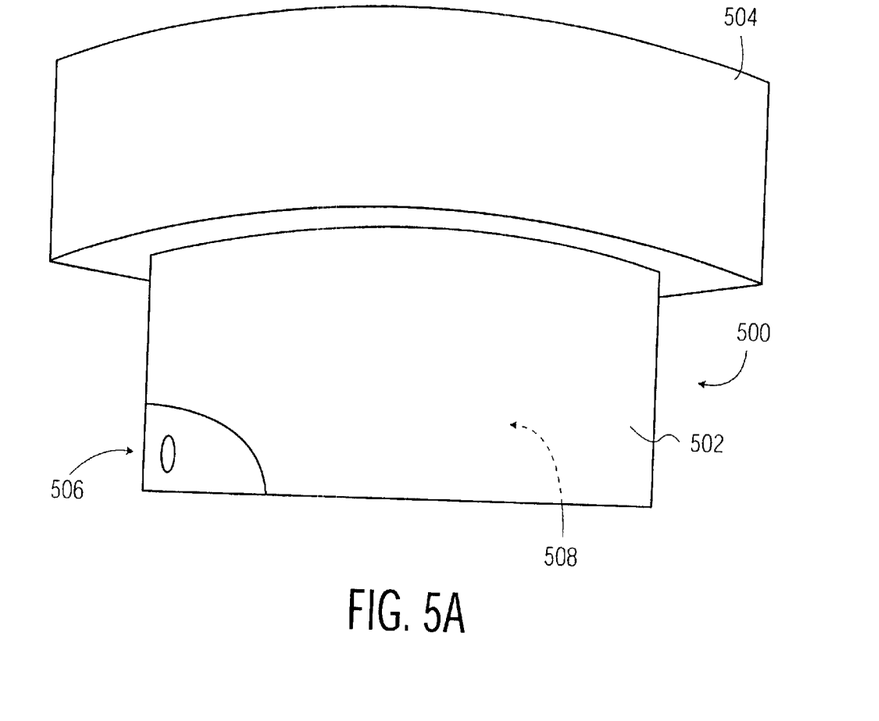
FIG. 5A is a front perspective view of a pebble display structure of this invention.
Figures 5B, 5C, 5D:
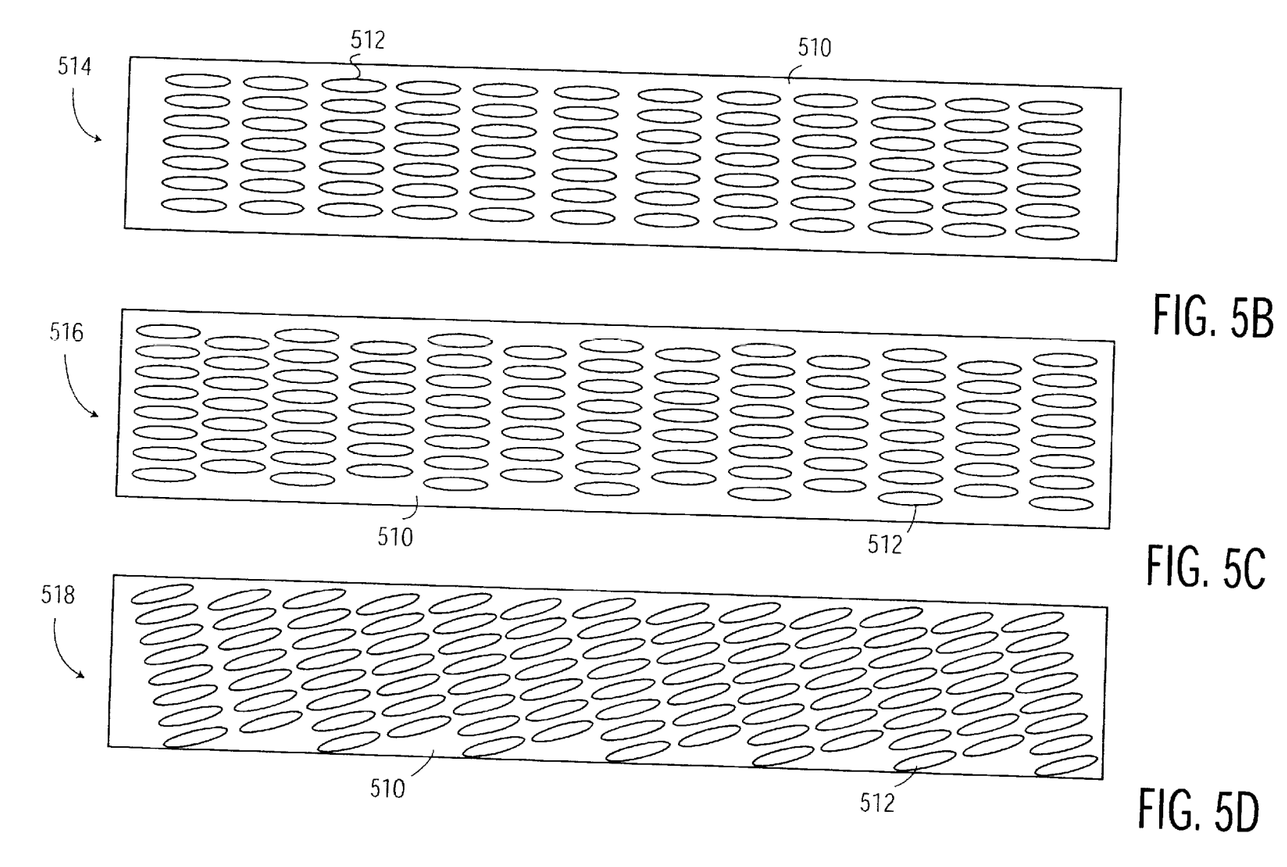
FIGS. 5B–D are front views of three pebble display arrangements on an interior surface of a structure of FIG. 5A.

Looking at FIG. 4F, another embodiment of the key 400 is shown in a top view including a circular shaped head portion 442 a having an oval shaped hole 444 and a broad tail portion 446. The head portion 442 smoothly transitions into the substantially straight tail portion 446. This embodiment can have any desired side view contouring including those shown in FIGS. 4B–D.

All of the keys 400 also include a readable media 448 embedded therein. The media 410 is shown as a strip in FIGS. 4A–E and as a flat element in FIG. 4F. However, the media 410 can be any size, shape, or material provided that it can store a code, which can be read by a reader in the pebble.

Referring to FIGS. 5A–D, a display, generally 500 of this invention is shown to include a support structure 502 having a top 504 and an entrance way 506. The structure also includes an interior 508 where the pebbles are displayed. Looking at FIGS. 5B–D, an interior surface 510 of the interior 508 is shown with pebbles 512 arranged in three different patterns 514, 516 and 518. It should be recognized that any interior surface can be used and that the pebbles can be arranged in any desired pattern. Additionally, the surfaces can be included on free standing or supported interior structures within the interior 508 of the structure 502. The structure 502 would of course house playback equipment in electronic communication with the pebbles so that the contents of the electronic data in each pebble can be played back.

Figure 6:
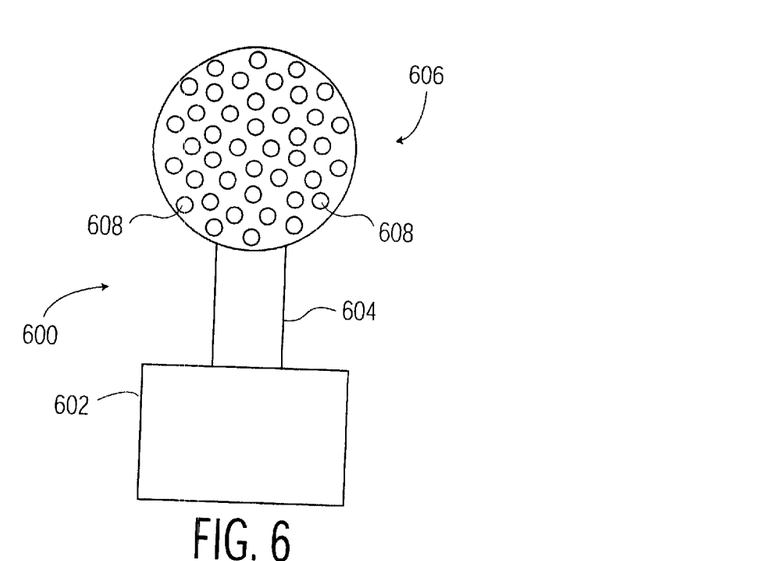
FIG. 6 is another embodiment of a pebble display structure of this invention.

Referring to FIG. 6, another display, generally 600, of the present invention is shown to include a base 602, a support column 604 and a spherical pebble holder 606 adapted to hold a plurality of pebbles 608. The pebbles 608 are shown here to be circular, but any shape is permitted. The base 602, column 604 and/or holder 606 would house playback equipment in electronic communication with the pebbles so that the contents of the electronic data in each pebble can be played back.

Figure 7:
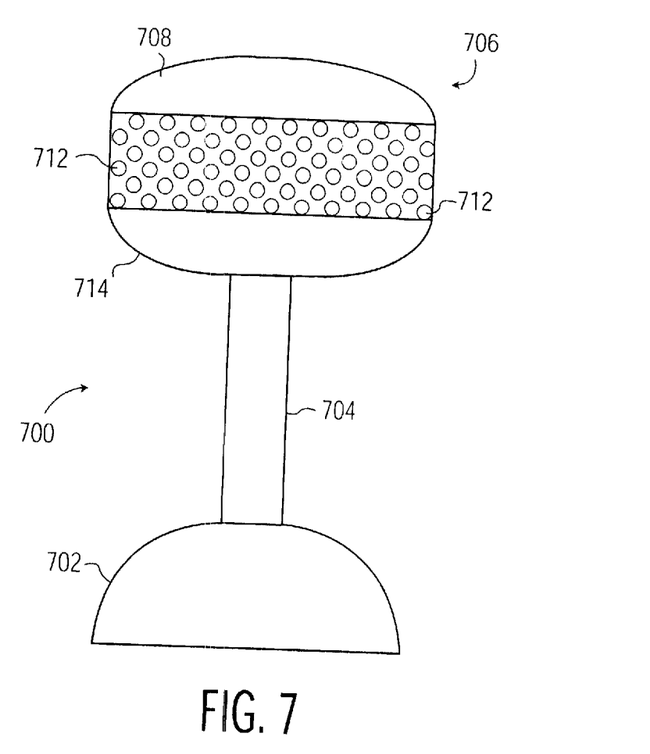
FIG. 7 is another embodiment of a pebble display structure of this invention.

Referring to FIG. 7, another embodiment of a display, generally 700, of the present invention is shown to include a base 702, a support column 704 and a donut shaped pebble holder 706 having a top 708, a pebble display middle 710 for displaying pebbles 712 and a bottom 714. Of course, pebbles could also be displayed on the top 708 and bottom 714. Again, the pebbles 712 are shown here to be circular, but any shape is permitted. The base 702, column 704 and/or holder 706 would house playback equipment in electronic communication with the pebbles so that the contents of the electronic data in each pebble can be played back.

Figure 8A:
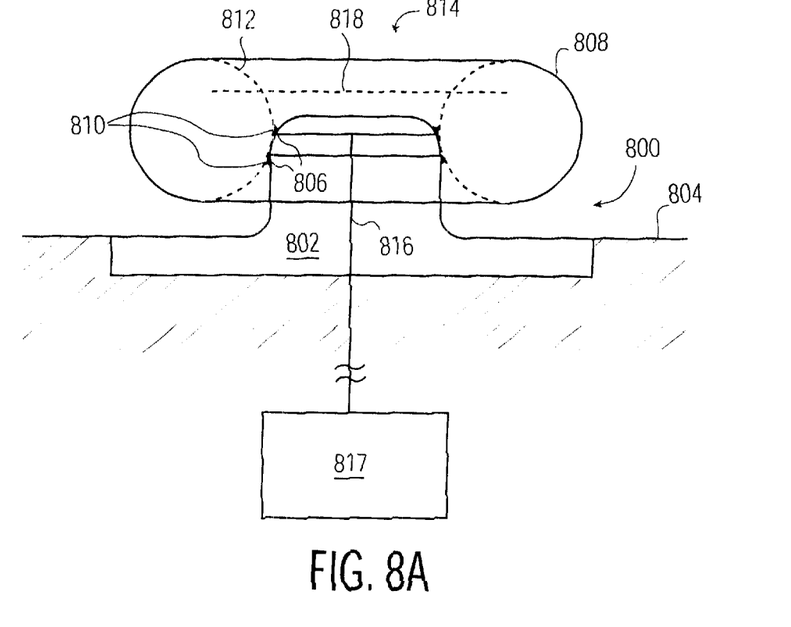
FIG. 8A is one embodiment of a pebble socket apparatus of this invention.

Referring to FIG. 8A, a pebble socket, generally 800, is shown to include a male fitting 802 protruding from a display surface 804 and having contacts 806. A torus shaped pebble 808 (as shown in FIG. 3C) is connected to the socket 800. The pebble 808 includes corresponding contacts 810 associated with an interior surface 812 of a hole 814 passing through the pebble 808. The contacts 806 place the pebble 808 into electrical communication with playback equipment in the display structure (not shown) via wires 816. Of course the communication could also via any other communication means such as fiber optic cable, coaxial cable, IR, sonic, RF, laser, microwave or the like. The wires 816 connect the socket 800 and its associated pebble 808 with a centralized playback unit 817. The playback unit 817 can have the contents of the pebbles electronic data stored thereon, if the electronic unit 312 has been removed from the pebble. The pebble 808 also includes a photograph 818 inserted therein.

Figure 8B:
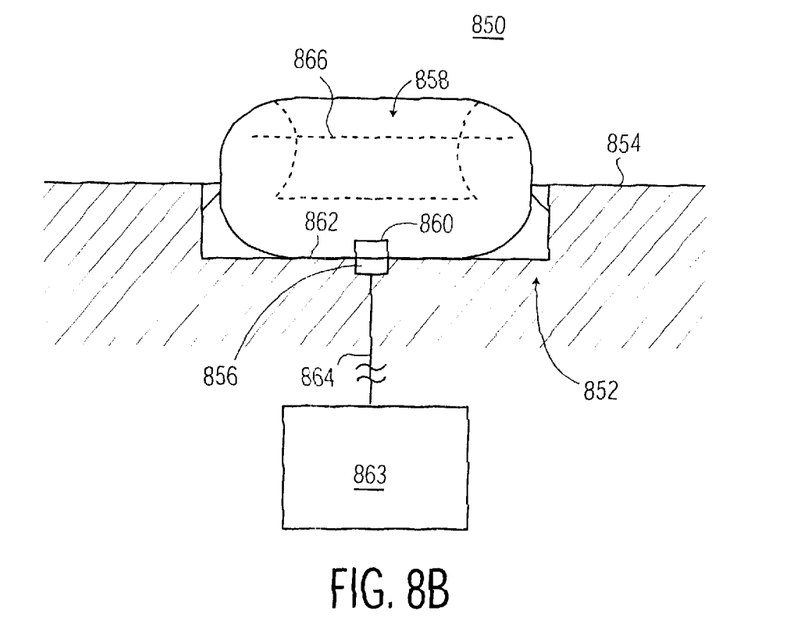
FIG. 8B is another embodiment of a pebble socket apparatus of this invention.

Referring to FIG. 8B, another embodiment of a pebble socket, generally 850, of the present invention is shown to include a female fitting 852 recessed in a display surface 854 and having connector 856. An oval shaped pebble 858 having a corresponding connector 860 associated with a bottom surface 862 of the pebble 858. Once the connectors are connected, the pebble 858 is placed into electrical communication with playback unit 863 in the display structure (not shown) via wires 864. Of course the communication could also via any other communication means such as fiber optic cable, coaxial cable, IR, sonic, RF, laser, microwave or the like. The pebble 858 also includes a photograph 866 inserted therein.

Figure 9:
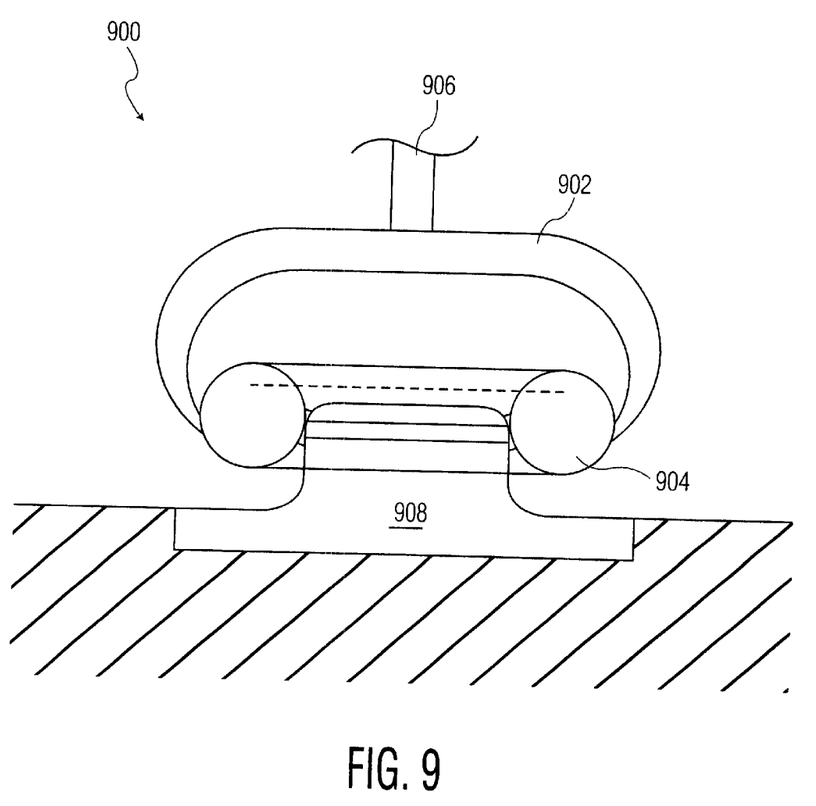
FIG. 9 is an illustrative example of a pebble mounting/dismounting apparatus of this invention.

Referring to FIG. 9, one illustrative example of a pebble mounting and demounting apparatus, generally 900, is shown to include a claw apparatus 902 capable of being positioned above a pebble 904 while the claw is in an opened state (not shown) and engaging the pebble 904 when in is closed state as shown. The arm 906 associated with the claw 902 can the pull the pebble from its socket 908 for storage in a pebble storage facility (not shown). The reverse of the process would allow the mounting apparatus to pick a pebble from the storage facility and plug it into a desired display socket on a display surface. The apparatus could and preferably would use computer-controlled robotics to facilitate mounting and demounting of pebbles.

If the pebble is designed to have its electronics remove before mounting, then a coded element would be placed in the pebble where code would include an address for the electronic data originally associated with the pebble. This can be achieved by using well known and commercially available passive or active tagging technologies. In the case of passive tagging technology, then there is no need for the pebble to be powered because those tags are designed to obtain power from a field.

Although the display units described in the Figures are physical display structure, the present invention is also directed to virtual storage of the contents of the pebbles for display on electronic display devices, such as CRTs, virtual reality goggles, projectors, IMAX theaters or the like.

All references cited herein are hereby incorporated by reference. While this invention has been described fully and completely, it should be understood that, within the scope of the appended claims, the invention might be practiced otherwise than as specifically described. Although the invention has been disclosed with reference to its preferred embodiments, from reading this description those of skill in the art may appreciate changes and modification that may be made which do not depart from the scope and spirit of the invention as described above and claimed hereafter.

I claim:

1. A method of personalized message storage and retrieval, comprising:
   respectively distributing a plurality of message recording units to a number of persons, each message recording unit being associated with an identity code unique within the system, each said message recording unit including a storage unit associated with the unique identity code and a key associated with the unique identity code;
   instructing each of the persons to record a personalized message in their message recording unit;
   storing each said respective personalized message in the respective storage unit of the respective message recording unit;
   instructing each of the persons to remove the key from their message recording unit after recording their personalized message;
   instructing each of the persons to forward their storage unit to a central message archive unit;
   retrieving and storing each respective personalized message along with the unique identity code associated with its respective storage unit into the central message archive unit; and
   reproducing a selected one of the personalized messages at the central message archive unit when presented with the unique identity code associated with said selected one of the personalized messages.

2. The method of claim 1, further comprising presenting the key associated with the unique identity code associated with said one of the personalized messages in order to reproduce the selected one of the personalized messages.

3. The method of claim 1, further comprising instructing each of the persons to deposit a personalized physical object in a receptacle of their storage unit before forwarding their storage unit to the central message archive unit.

4. The method of claim 3, further comprising storing one of the personalized physical object and an electronic representation of the personalized physical object along with the unique identity code associated with its respective storage unit in the central message archive unit.

5. The method of claim 4, further comprising presenting the key associated with the unique identity code associated with said one of the personalized messages in order to reproduce the selected one of the personalized messages and said one of the personalized physical object and the electronic representation of the personalized physical object associated with its respective storage unit.

6. A personalized message storage and retrieval system, comprising:
   a central message archive unit;
   a plurality of message recording units, each message recording unit being associated with an identity code unique within the system, each said message recording unit including a storage unit associated with the unique identity code and a key associated with the unique identity code, the key being removably connected with the storage unit, the storage unit being able to record a personalized message at a location remote from the central message archive unit while the key is connected with the storage unit, and being unable to record the personalized message while the key is removed from the storage unit;
   means for storing each respective personalized message of the plurality of message recording units along with each respective unique identity code associated with its respective storage unit into the central message archive unit; and
   means for reproducing a selected one of the personalized messages at the central message archive unit when presented with the unique identity code associated with said selected one of the personalized messages.

7. The system of claim 6, wherein the central message archive unit comprises means for reading the respective unique identity code from any said key for selecting said selected one of the personalized messages to be reproduced.

8. The system of claim 6, wherein each of said storage units includes a receptacle for depositing a personalized physical object.

9. The system of claim 8, further comprising means for storing one of the personalized physical object and an electronic representation of the personalized physical object along with the unique identity code associated with its respective storage unit in the central message archive unit.

10. The system of claim 9, wherein the central message archive unit comprises means for reading the unique identity code from any said key for selecting said selected one of the personalized messages to be reproduced, and further comprising means for reproducing said one of the personalized physical object and the electronic representation of the personalized physical object associated with the unique identity code.

* * * * *